(12) United States Patent
Nakamura et al.

(10) Patent No.: US 9,161,444 B2
(45) Date of Patent: Oct. 13, 2015

(54) CIRCUIT BOARD AND ELECTRONIC APPARATUS PROVIDED WITH THE SAME

(71) Applicant: KYOCERA Corporation, Kyoto-shi, Kyoto (JP)

(72) Inventors: Kiyotaka Nakamura, Kirishima (JP); Yoshio Ohashi, Satsumasendai (JP); Kunihide Shikata, Kirishima (JP)

(73) Assignee: KYOCERA CORPORATION, Kyoto-Shi (JP)

( * ) Notice: Subject to any disclaimer, the term of this patent is extended or adjusted under 35 U.S.C. 154(b) by 0 days.

(21) Appl. No.: 14/354,600

(22) PCT Filed: Sep. 28, 2012

(86) PCT No.: PCT/JP2012/075166
§ 371 (c)(1),
(2) Date: Apr. 28, 2014

(87) PCT Pub. No.: WO2013/061727
PCT Pub. Date: May 2, 2013

(65) Prior Publication Data
US 2014/0284088 A1      Sep. 25, 2014

(30) Foreign Application Priority Data

Oct. 28, 2011   (JP) .................................. 2011-237451

(51) Int. Cl.
*H05K 1/00* (2006.01)
*H05K 1/09* (2006.01)
*H05K 3/38* (2006.01)
(Continued)

(52) U.S. Cl.
CPC ................ *H05K 1/09* (2013.01); *C04B 41/009* (2013.01); *C04B 41/52* (2013.01); *C04B 41/90* (2013.01); *H01L 23/15* (2013.01);
(Continued)

(58) Field of Classification Search
CPC ............. H05K 1/03; H05K 1/11; H05K 1/16; H05K 3/10; H05K 3/20; H05K 13/00; H01L 23/48
USPC .......... 174/252, 255, 258; 361/748, 771, 793; 427/98.5, 304, 305, 383.5; 428/172; 257/774
See application file for complete search history.

(56) References Cited

U.S. PATENT DOCUMENTS 4,604,299 A * 8/1986 De Luca et al. ............... 427/98.5
4,910,643 A * 3/1990 Williams ....................... 361/793
(Continued)

FOREIGN PATENT DOCUMENTS

| JP | 2003224338 A | 8/2003 |
|---|---|---|
| JP | 2003243804 A | 8/2003 |

OTHER PUBLICATIONS

English language abstract of JP 2003224338 A of Aug. 8, 2003.
(Continued)

*Primary Examiner* — Xiaoliang Chen

(57) ABSTRACT

A circuit board is provided with a metal wiring layer 12 on at least one principal surface of a ceramic sintered body 11, wherein the above-described metal wiring layer includes a first region 12a which is in contact with the principal surface and which contains a glass component and a second region 12b which is located on the first region 12a and which does not contain a glass component, the thickness of the first region 12a is 35% or more and 70% or less of the thickness of the metal wiring layer 12, and the average grain size in the first region 12a is smaller than the average grain size in the second region 12b.

6 Claims, 1 Drawing Sheet

(51) Int. Cl.
*H01L 23/15* (2006.01)
*C04B 41/90* (2006.01)
*C04B 41/00* (2006.01)
*C04B 41/52* (2006.01)
*H05K 1/03* (2006.01)
*H01L 23/373* (2006.01)
*C04B 111/00* (2006.01)

(52) U.S. Cl.
CPC ........... *H01L 23/3731* (2013.01); *H05K 1/092* (2013.01); *H05K 3/38* (2013.01); *C04B 2111/00405* (2013.01); *C04B 2111/00844* (2013.01); *H01L 23/3735* (2013.01); *H01L 23/3736* (2013.01); *H05K 1/0306* (2013.01); *H05K 2201/035* (2013.01); *H05K 2201/0338* (2013.01); *H05K 2203/1126* (2013.01)

(56) References Cited

U.S. PATENT DOCUMENTS

| | | | |
|---|---|---|---|
| 6,514,364 B2 * | 2/2003 | Miura et al. | 156/89.12 |
| 2001/0023779 A1 * | 9/2001 | Sugaya et al. | 174/255 |
| 2009/0051041 A1 * | 2/2009 | Otsuka et al. | 257/774 |
| 2010/0000768 A1 * | 1/2010 | Maeda et al. | 174/255 |
| 2012/0015152 A1 * | 1/2012 | Takahashi et al. | 428/172 |
| 2012/0321805 A1 * | 12/2012 | Takahashi | 427/383.5 |
| 2013/0182397 A1 * | 7/2013 | Abe et al. | 361/748 |

OTHER PUBLICATIONS

English language abstract of JP 2003243804 A of Aug. 29, 2003.

* cited by examiner

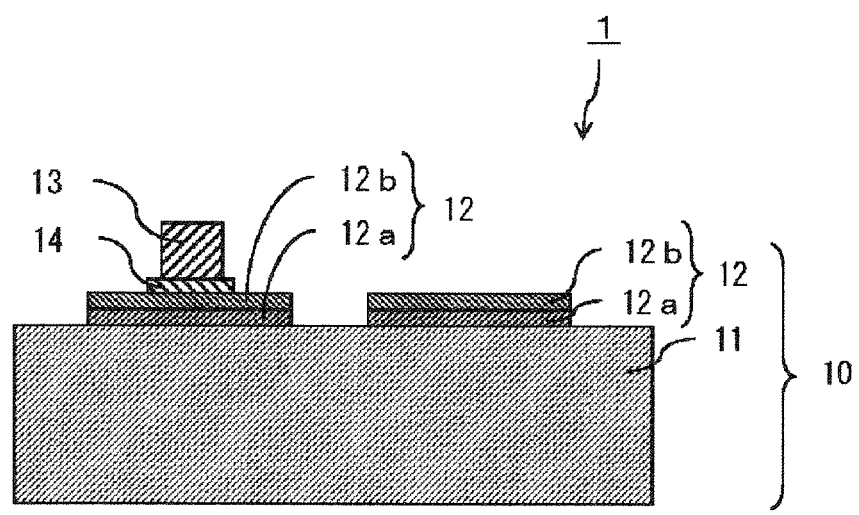

CIRCUIT BOARD AND ELECTRONIC APPARATUS PROVIDED WITH THE SAME

TECHNICAL FIELD

The present invention relates to a circuit board and an electronic apparatus in which an electronic component is mounted on the circuit board.

BACKGROUND ART

A circuit board used for mounting various electronic components, e.g., a semiconductor element, a heater element, or a Peltier element, is provided with a metal wiring layer on at least one principal surface of a ceramic sintered body. An electronic apparatus in which an electronic component is mounted on the metal wiring layer in the circuit board with an electrode pad or the like therebetween has been used in various apparatuses.

Meanwhile, with respect to such a circuit board, for the purpose of suppressing peeling of the metal wiring layer from the ceramic sintered body because of the heat generated during operation of the electronic component mounted on the circuit board, development of a material for a paste serving as the metal wiring layer and studies on a method for forming the metal wiring layer have been performed to enhance the adhesion strength to the ceramic sintered body.

For example, PTL 1 proposes a method for manufacturing a thick film circuit board by using a copper conductor paste. In the method for manufacturing a thick film circuit board by printing the copper conductor paste on a substrate and forming a copper film through firing, a first layer is formed by printing the copper conductor paste containing glass frit on a ceramic substrate and performing drying and, subsequently, at least one layer is formed thereon by printing the copper conductor paste not containing glass frit and performing drying, followed by firing to form a thick copper film.

CITATION LIST

Patent Literature

PTL 1: Japanese Unexamined Patent Application Publication No. 2003-243804

SUMMARY OF INVENTION

Technical Problem

In recent years, electronic components have been highly integrated and electronic apparatuses have been miniaturized and slimmed, so that an amount of heat applied to a circuit board on a volume basis has increased. Consequently, at present, a metal wiring layer constituting the circuit board is required to have good heat dissipation characteristics capable of promptly dissipating the heat generated on the basis of operations of an electronic component and high adhesion strength to a ceramic sintered body to reduce peeling due to cooling/heating cycles when operation and non-operation of the electronic component are repeated, and a circuit board exhibiting high reliability to satisfy such requirements is desired.

The present invention has been devised to satisfy the above-described requirements and provides a highly reliable circuit board usable for a long term and an electronic apparatus in which an electronic component is mounted on the circuit board.

Solution to Problem

A circuit board according to the present invention is provided with a metal wiring layer on at least one principal surface of a ceramic sintered body, wherein the above-described metal wiring layer includes a first region which is in contact with the above-described principal surface and which contains a glass component and a second region which is located on the above-described first region and which does not contain the glass component, the thickness of the above-described first region is 35% or more and 70% or less of the thickness of the above-described metal wiring layer, and the average grain size of a metal in the above-described first region is smaller than the average grain size of a metal in the above-described second region.

Meanwhile, in an electronic apparatus according to the present invention, an electronic component is mounted on the circuit board, according to the present invention, having the above-described configuration.

Advantageous Effects of Invention

The circuit board according to the present invention can be a circuit board exhibiting high reliability, wherein a metal wiring layer has high adhesion strength to a ceramic sintered body and good heat dissipation characteristics in combination and, thereby, peeling of the metal wiring layer from the ceramic sintered body due to cooling/heating cycles when operation and non-operation of the electronic component are repeated is reduced.

In addition, according to the electronic apparatus of the present invention, an electronic component is mounted on the circuit board, according to the present invention, having the above-described configuration and, thereby, an electronic apparatus exhibiting high reliability enabling a long term of use can be provided.

BRIEF DESCRIPTION OF DRAWING

FIG. 1 is a sectional view showing an example of an electronic apparatus provided with a circuit board according to the present embodiment.

DESCRIPTION OF EMBODIMENTS

An example according to the present embodiment will be described below with reference to the drawing. FIG. 1 is a sectional view showing an example of an electronic apparatus provided with a circuit board according to the present embodiment. In an electronic apparatus 1 according to the present embodiment, an electronic component 13 is mounted on a circuit board 10 in which a metal wiring layer 12 is provided on one principal surface of a ceramic sintered body 11. In this regard, in the example shown in FIG. 1, the electronic component 13 is mounted on the metal wiring layer 12 with an electrode pad 14 therebetween.

Then, in the circuit board 10 according to the present embodiment, the metal wiring layer 12 includes a first region 12a which is in contact with one principal surface of the ceramic sintered body 11 and which contains the glass component and a second region 12b which is located on the first region 12a and which does not contain a glass component. In this regard, the thickness of the first region 12a is 35% or more and 70% or less of the thickness of the metal wiring layer 12, and the average grain size of a metal in the first region 12a is smaller than the average grain size of a metal in the second region 12b.

The circuit board 10 according to the present embodiment can be a circuit board 10 exhibiting high reliability, wherein the metal wiring layer 12 has high adhesion strength to the ceramic sintered body 11 and good heat dissipation characteristics in combination and, thereby, peeling of the metal wiring layer 12 from the ceramic sintered body 11 due to cooling/heating cycles when operation and non-operation of the electronic component 13 are repeated is reduced.

The reasons the metal wiring layer 12 can have high adhesion strength to the ceramic sintered body 11 and good heat dissipation characteristics in combination will be described below.

To begin with, the glass component in the first region 12a suppresses growth of metal grains during formation of the first region 12a, so that dense first region 12a can be formed. Then, the above-described denseness can firmly support the glass component present between metal grains and, therefore, the adhesion strength to the ceramic sintered body 11 can be enhanced. Also, the second region 12b does not contain the glass component, so that the electric resistance increases and the heat dissipation characteristics are not degraded.

Also, the thickness of the first region 12a is specified to be 35% or more and 70% or less relative to the thickness of the metal wiring layer 12 because if the thickness of the first region 12a is less than 35% relative to the metal wiring layer 12, the adhesion strength to the ceramic sintered body 11 cannot be enhanced and because if the thickness of the first region 12a is more than 70% relative to the metal wiring layer 12, the thickness of the second region 12b is decreased and the heat dissipation characteristics cannot be enhanced.

Also, the average grain size of a metal in the first region 12a is smaller than the average grain size of a metal in the second region 12b and, thereby, the adhesion strength to the ceramic sintered body 11 can be enhanced. In addition, the average grain size of a metal in the second region 12b is larger than the average grain size of a metal in the first region 12a and, thereby, enhancement of the heat dissipation characteristics of the metal wiring layer 12 is facilitated.

Next, the boundary between the first region 12a and the second region 12b can be identified by, for example, a method described below. Initially, the circuit board 10 provided with the metal wiring layer 12 on the principal surface of the ceramic sintered body 11 is cut in the thickness direction, and the resulting surface is specified to be a measurement surface. Subsequently, this measurement surface is subjected to mapping by using an electron probe microanalyzer (EPMA), and the boundary between the first region 12a and the second region 12b can be identified by examining the resulting mapping. Specifically, in the case where silicon oxide is contained as the glass component, the region where the existence region of Si in the mapping and the existence region of O in the mapping overlap one another is the first region 12a and the region other than that is the second region 12b. In this regard, if the boundary of the existence region can be identified by only the mapping of Si without superimposition on the mapping of O, it can be said that the boundary is the boundary between the first region 12a and the second region 12b.

Meanwhile, as for a method for measuring the average grain size, initially, a plated copper wire or the like is soldered to the metal wiring layer 12 on the ceramic sintered body 11 and, thereafter, the metal wiring layer 12 is peeled from the ceramic sintered body 11 by pulling this plated copper wire. Here, the peeling surface serves as a measurement surface for measuring the average grain size of a metal in the first region 12a and the surface opposite to the peeling surface serves as a measurement surface for measuring the average grain size of a metal in the second region 12b. In this regard, as for the pretreatment, it is possible that the individual measurement surfaces are observed with a scanning electron microscope (SEM) at a magnification of 3,000 times and the average grain sizes can be calculated by using image analysis software "A-zou kun" (registered trade mark, produced by Asahi Kasei Engineering Corporation).

Then, it is preferable that the average grain size of a metal in the first region 12a be 3.0 µm or more and 8.0 µm or less. In the case where the average grain size of a metal in the first region 12a is 3.0 µm or more and 8.0 µm or less, the adhesion strength can be enhanced and the heat dissipation characteristics of the first region 12a can be improved.

Also, it is preferable that the average grain size in the second region 12b be 9.0 µm or more and 13.0 µm or less. In the case where the average grain size in the second region 12b is 9.0 µm or more and 13.0 µm or less, the value of arithmetic average roughness of the surface of the metal wiring layer 12 serving as the mounting surface of the electronic component 13, that is, the surface of the second region 12b, can be reduced while good heat dissipation characteristics are exhibited. In this regard, in the description hereafter, the surface of the metal wiring layer 12 refers to the upper surface of the second region in FIG. 1.

Next, the metal wiring layer 12 constituting the circuit board 10 according to the present embodiment preferably contains copper, silver, or aluminum as a primary component, and particularly preferably contains copper as a primary component. In the case where the metal wiring layer 12 contains copper as a primary component, the heat dissipation characteristics can be enhanced because copper has high thermal conductivity. In addition, at least one type of zirconium, titanium, molybdenum, tin, and zinc may be contained as an accessory component. In this regard, the primary component of the metal wiring layer 12 refers to a component which is more than 50 percent by mass among the components constituting the metal wiring layer 12.

Also, it is preferable that copper oxide be present on the surface of the metal wiring layer 12, and 15 or more and 80 or less of copper oxide grains be present at grain boundaries in 1,000 µm$^2$ of observation region. In the case where the metal wiring layer 12 includes pores, when the surface of the metal wiring layer 12 is subjected to a plating treatment, if a plating solution penetrates along the pores, the glass component is eroded and the adhesion strength to the ceramic sintered body 11 is reduced. In particular, erosion is considerable in the case where Bi is contained in the glass components. On the other hand, in the case where copper oxide is present on the surface of the metal wiring layer 12, and 15 or more and 80 or less of copper oxide grains are present at grain boundaries in 1,000 µm$^2$ of observation region, pores are filled with copper oxide present at grain boundaries and, thereby, the pores can be reduced, so that high adhesion strength can be maintained after the plating treatment as well. In addition, in the case where 15 or more and 80 or less of copper oxide grains are present, the fear of increase in the electric resistance is reduced, so that high adhesion strength can be maintained after the plating treatment as well and low electric resistance can be maintained.

Meanwhile, as for the method for counting copper oxide, the surface of the metal wiring layer 12 is observed by using SEM at a magnification of 3,000 times and existence places of grain boundaries in the observation region are examined. In addition, the region where the existence region of Cu in the mapping and the existence region of O in the mapping obtained by using EPMA overlap one another is the existence place of copper oxide. Then, the existence places of grain boundaries are checked against existence places of copper oxide. The places where the existence places of the two overlap one another indicate copper oxide grains present at grain boundaries and, therefore, the number of them may be counted.

In this regard, in the case where the observation region is smaller than or larger than 1,000 μm$^2$, the number of cupper oxide grains obtained by actual measurement in the observation region may be converted to the number of cupper oxide grains in 1,000 μm$^2$ of observation region.

Also, it is preferable that silicon oxide constitute the glass component in the first region 12a and silicon oxide on the second region 12b side be more than silicon oxide on the principal surface side of the first region 12a. In the case where such a configuration is employed and the surface of the metal wiring layer 12 is subjected to a plating treatment, even when a plating solution penetrates the inside of the metal wiring layer 12, high adhesion strength can be maintained after the plating treatment as well because a large amount of silicon oxide exhibiting high chemical resistance is present on the second region 12b side in the first region 12a and, thereby, the fear of erosion of the glass component, which has a significant influence on the adhesion strength of the metal wiring layer 12 to the ceramic sintered body 11, on the principal surface side in the first region 12a is reduced.

In this regard, the principal surface side in the first region 12a refers to a portion from the principal surface of the ceramic sintered body 11 to the position corresponding to ⅕ of the thickness of the first region 12a, and the second region 12b side refers to a portion from the boundary between the first region 12a and the second region 12b to the position corresponding to ⅕ of the thickness of the first region 12a. Meanwhile, the contents of silicon oxide on the principal surface side and the second region 12b side may be determined by cutting the circuit board 10 provided with the metal wiring layer 12 on the principal surface of the ceramic sintered body 11 in the thickness direction, performing cross-section polishing and, thereafter, observing the principal surface side and the second region 12b side in the first region 12a by using SEM at a magnification of 3,000 times, followed by using an attached energy dispersive spectrometer (EDS).

Also, as for the ceramic sintered body 11 constituting the circuit board 10 according to the present embodiment, an aluminum oxide based sintered body, a zirconium oxide based sintered body, a composite sintered body of aluminum oxide and zirconium oxide, a silicon nitride based sintered body, an aluminum nitride based sintered body, or a mullite based sintered body can be used. In this regard, it is preferable that the ceramic sintered body 11 is formed from an aluminum oxide based sintered body from the viewpoint of the production cost containing a raw material cost and the formability of the substrate.

Also, as for the electronic component 13 mounted on the circuit board 10, for example, semiconductor elements, e.g., an insulated gate bipolar transistor (IGBT) element, an intelligent power module (IPM) element, a metal oxide semiconductor field effect transistor (MOSFET) element, a light-emitting diode (LED) element, a freewheeling diode (FWD) element, a giant transistor (GTR) element, and a schottky barrier diode (SBD), a heater element for sublimation thermal printer head or thermal ink-jet printer head, and a Peltier element can be used.

An example of the method for manufacturing the circuit board 10 according to the present invention will be described below.

Initially, an aluminum oxide based sintered body is produced by using a powder of aluminum oxide ($Al_2O_3$) and powders of silicon oxide ($SiO_2$), magnesium oxide (MgO), calcium oxide (CaO), and the like serving as sintering aids on the basis of a known method.

Subsequently, a metal paste serving as the metal wiring layer 12 is prepared. In this regard, as for this metal paste, a first metal paste to form the first region 12a and a second metal paste to form the second region 12b are prepared. The first metal paste includes a metal powder containing copper, silver, or aluminum as a primary component, a glass powder, and an organic vehicle. Also, the second metal paste includes a metal powder containing at least one type of copper, silver, and aluminum as a primary component and an organic vehicle. In addition, a metal oxide powder may be added to each metal paste, as necessary.

Here, an example of the first metal paste to form the first region 12a, where copper is a primary component, will be described. To begin with, as for the metal powder, a first metal powder having an average particle diameter of 1.0 μm or more and 3.5 μm or less and a second metal powder having an average particle diameter of 13.5% or more and 16.5% or less of the average particle diameter of the first metal powder are prepared. Then, a mixed metal powder composed of 65 percent by mass or more and 75 percent by mass or less of first metal powder and 25 percent by mass or more and 35 percent by mass or less of second metal powder is used. In particular, it is preferable that a metal powder in which 68 percent by mass or more and 72 percent by mass or less of first metal powder and 28 percent by mass or more and 32 percent by mass or less of second metal powder are mixed be used. Likewise, in the case where silver or aluminum is a primary component, it is preferable that a mixed metal powder be used.

When the mixed metal powder having the above-described composition is used, the second metal powder having an average particle diameter of 13.5% or more and 16.5% or less of the average particle diameter of the first metal powder enters gaps between particles of the first metal powder having a large average particle diameter, so that gaps between particles of the first metal powder are filled and, in addition, the sinterability of the first metal paste can be improved. Therefore, the first region 12a can be formed densely.

Next, it is preferable that the glass powder having a softening point of 600° C. or higher and 700° C. or lower be used. In the case where the softening point is 600° C. or higher and 700° C. or lower, in firing of the first metal paste, the first region 12a can be made dense because growth of particles of metal powder is suppressed as compared with the glass powder having a softening point of lower than 600° C. and, in addition, the glass component which enhances the adhesion strength is present easily at the boundary between the ceramic sintered body 11 and the first region 12a as compared with the glass powder having a softening point of higher than 700° C. Therefore, the adhesion strength between the ceramic sintered body 11 and the first region 12a can be enhanced.

Examples of types of the glass powder include $SiO_2$ base, ZnO base, $R_2O$—$SiO_2$ base (R: alkali metal element), $R_2O$—ZnO—$SiO_2$ base, $SiO_2$—$B_2O_3$ base, $SiO_2$—ZnO—$B_2O_3$ base, $R_2O$—$SiO_2$—$B_2O_3$ base, $R_2O$—ZnO—$SiO_2$—$B_2O_3$ base, $SiO_2$—$B_2O_3$—$Bi_2O_3$ base, $SiO_2$—ZnO—$B_2O_3$—$Bi_2O_3$ base, $R_2O$—$SiO_2$—$B_2O_3$—$Bi_2O_3$ base, and $R_2O$—$SiO_2$—ZnO—$B_2O_3$—$Bi_2O_3$ base. In particular, it is preferable that the glass powder containing $Bi_2O_3$ be used. This is because in the case where the glass powder containing $Bi_2O_3$ is used, the wettability of the first metal paste to the ceramic sintered body 11 becomes good and, thereby, the adhesion strength between the ceramic sintered body 11 and the first region 12a can be enhanced.

Also, the average particle diameter of the glass powder is preferably 0.5 µm or more and 4.0 µm or less. In particular, in the case where the configuration of the metal powder used for the first metal paste is within the above-described range, when the average particle diameter is 0.5 µm or more and 4.0 µm or less, the first region 12a can be made denser and, in addition, the adhesion strength between the ceramic sintered body 11 and the first region 12a can be further enhanced.

Meanwhile, in the organic vehicle, an organic binder is dissolved in an organic solvent. For example, as for the ratio of the organic solvent to the organic binder, the organic solvent is 2 to 6 relative to 1 of organic binder. Then, for example, acrylics, e.g., polybutyl methacrylates and polymethyl methacrylates, celluloses, e.g., nitrocellulose, ethyl cellulose, cellulose acetate, and butyl cellulose, polyethers, e.g., plyoxymethylenes, and polyvinyls, e.g., polybutadienes and polyisoprenes, can be used alone or in combination as the organic binder.

Also, for example, carbitol, carbitol acetate, terpineol, metacresol, dimethylimidazole, dimethylimidazolidinone, dimethylformamide, diacetone alcohol, triethylene glycol, paraxylene, ethyl lactate, and ispholone can be used alone or in combination as the organic solvent.

In this regard, the blending ratio of the metal powder, the glass powder, and the organic vehicle in the first metal paste is specified to be within the range of 77.0 percent by mass or more and 87.0 percent by mass or less of metal powder, 0.5 percent by mass or more and 5 percent by mass or less of glass powder, and 10 percent by mass or more and 20 percent by mass or less of organic vehicle, where the first metal paste is specified to be 100 percent by mass.

Meanwhile, in the case where the ceramic sintered body 11 is an aluminum oxide based sintered body and the metal oxide contained in the first metal paste is copper oxide (CuO or $Cu_2O$), copper aluminate ($CuAl_2O_4$ or $CuAlO_2$) is generated easily and the adhesion strength between the ceramic sintered body 11 and the first region 12a can be enhanced. Also, in the case where the metal oxide contained in the first metal paste is aluminum oxide ($Al_2O_3$), the thermal expansion coefficient of the first region 12a can be made close to the thermal expansion coefficient of the aluminum oxide based sintered body, and the fear of peeling of the ceramic sintered body 11 from the first region 12a due to a difference in thermal expansion coefficient between the ceramic sintered body 11 and the first region 12a can be reduced.

Next, the second metal paste to form the second region 12b will be described. As for the metal powder, a metal powder having an average particle diameter of 2.0 µm or more and 4.5 µm or less is used. In this regard, the same organic vehicle and organic solvent as those used for the first metal paste may be used.

Then, the blending ratio of the metal powder and the organic vehicle in the second metal paste is specified to be within the range of 80 percent by mass or more and 90 percent by mass or less of metal powder and 10 percent by mass or more and 20 percent by mass or less of organic vehicle, where the second metal paste is specified to be 100 percent by mass. The second metal paste is allowed to have the above-described configuration and the second metal paste does not contain the glass powder, so that growth of particles of the metal powder is not suppressed. Consequently, the average grain size in the second region 12b becomes larger than the average grain size in the first region 12a and the second region 12b can have good heat dissipation characteristics.

Next, a method for forming the metal wiring layer 12 by using the first metal paste and the second metal paste will be described. Initially, the first region 12a is formed by printing the first metal paste on the principal surface of the ceramic sintered body 11 by a known screen printing method, performing drying and, thereafter performing firing. Subsequently, the second region 12b can be formed by printing the second metal paste on the first region 12a, performing drying and, thereafter, performing firing. In this manner, the metal wiring layer 12 composed of the first region 12a and the second region 12b is formed.

In this regard, in order to obtain a desired thickness, the cycle of printing and drying of the first metal paste and the second metal paste may be performed a plurality of times and firing may be performed. However, when the first metal paste containing the glass powder and the second metal paste are fired at the same time, the glass component in the first metal paste may move and the glass component may remain in the second region 12b. Therefore, it is preferable that the printing of the second metal paste be performed on the first region 12a having been subjected to firing. Consequently, the glass component does not remain in the second region 12b, so that the heat dissipation characteristics can be exhibited sufficiently.

In addition, in the case where drying and firing are performed after every printing, the organic vehicle in the metal paste can be sufficiently removed through vaporization. Therefore, generation of blister in the resulting metal wiring layer 12 is reduced and remaining organic materials are also reduced, so that the fear of causing degradation in heat dissipation characteristics can be reduced.

Then, the drying of the above-described first metal paste and second metal paste is performed at a temperature of 80° C. or higher and 150° C. or lower, and the firing is performed by holding at a maximum temperature of 850° C. or higher and 1,050° C. or lower for 0.5 hours or more and 3 hours or less. Also, in the case where the metal powder is aluminum, firing may be performed by holding at a maximum temperature of 500° C. or higher and 600° C. or lower for 0.5 hours or more and 3 hours or less. Also, in the case where the metal powder is silver, firing may be performed by holding at a maximum temperature of 800° C. or higher and 1,000° C. or lower for 0.5 hours or more and 3 hours or less. In this regard, as for the atmosphere in this firing, in order to suppress oxidation of the metal paste, for example, firing is performed in a nitrogen atmosphere in which the oxygen concentration is low. Consequently, the circuit board 10 provided with the metal wiring layer 12 on the principal surface of the ceramic sintered body 11 can be obtained by the above-described manufacturing method.

Meanwhile, part of or all over the surface of the metal wiring layer 12 may be subjected to a plating treatment. The adhesion treatment of the electrode pad 14, the bonding wire 15, and the like is performed easily by performing the above-described plating treatment, and the oxidation corrosion of the metal wiring layer 12 can be suppressed. Known plating may be employed and examples of the types of plating can include gold plating, silver plating, and nickel-gold plating.

Alternatively, in formation of the metal wiring layer 12, after a metal wiring layer 12 including the first region 12a and the second region 12b is formed, for example, all over the principal surface of the ceramic sintered body 11, the metal wiring layer 12 may be formed in the necessary region by forming a resist film in the necessary region of the metal wiring layer 12, performing etching by using, for example, an etching solution made from ferric chloride, cupric chloride, or an alkali and, subsequently, removing the resist film by using a sodium hydroxide aqueous solution or the like.

In this regard, the thickness of the metal wiring layer 12 is preferably 30 µm or more and 80 µm or less. In the case where the thickness of the metal wiring layer 12 is 30 µm or more and 80 μm or less, the heat on the basis of operations of the electronic component 13 can be dissipated. In addition, high adhesion strength to the ceramic sintered body 11 is obtained, and in formation of the metal wiring layer 12 by etching, the interval of the metal wiring layer 12 can be reduced, and reduction in pitch and thinning can be achieved.

Also, a through hole may be disposed in the ceramic sintered body 11, and a through conductor may be formed in the through hole by using, for example, the first metal paste and be connected to the metal wiring layer 12 to improve the heat dissipation characteristics. In addition, the metal wiring layer 12 may also be formed on the other principal surface of the ceramic sintered body 11 and be connected to the through conductor to further improve the heat dissipation characteristics.

Meanwhile, for the purpose of allowing copper oxide to be present on the surface of the metal wiring layer 12, copper may be used as a metal powder and the oxygen concentration in the firing atmosphere in the firing may be adjusted. For the purpose of allowing 15 or more and 80 or less of copper oxide grains to be present at grain boundaries in 1,000 μm² of observation region of the surface of the metal wiring layer 12, a metal powder exhibiting d10 of 1 to 2 μm in particle size distribution may be used, and the oxygen concentration in the firing atmosphere may be specified to be 30 to 120 ppm.

Meanwhile, for the purpose of allowing the amount of silicon oxide, which constitutes the glass component in the first region 12a, on the second region 12b side to become larger than that on the principal surface side of the first region 12a, two types of pastes having different silicon oxide contents may be prepared as the first metal paste to form the first region 12a, and the first region 12a may be formed by using the paste having a smaller silicon oxide content for the principal surface side and using the paste having a larger silicon oxide content for the second region 12b side.

Then, the circuit board 10, according to the present embodiment, obtained by the above-described manufacturing method has good heat dissipation characteristics capable of promptly dissipating the heat generated by the metal wiring layer 12 on the basis of operations of the electronic component and has high adhesion strength to the ceramic sintered body, so that peeling of the metal wiring layer 12 due to cooling/heating cycles when operation and non-operation of the electronic component 13 are repeated is reduced. Therefore, the circuit board 10 can exhibit high reliability enabling a long term of use.

In this regard, the method for manufacturing the circuit board 10 according to the present embodiment is not limited to the above-described manufacturing method. Meanwhile, as for the circuit board 10, it is possible to produce the circuit board 10 according to the present embodiment efficiently by using the ceramic sintered body 11 provided with a division groove, forming the metal wiring layer 12 by the above-described method and, thereafter, performing division.

Then, the electronic component 13 is mounted on the metal wiring layer 12 with, for example, the electrode pad 14 therebetween and, thereby, the electronic apparatus 1 according to the present embodiment can be produced. The resulting electronic apparatus 1 according to the present embodiment is produced by mounting the electronic component 13 on the circuit board 10 exhibiting high reliability enabling a long term of use, as described above. Consequently, the electronic apparatus 1 according to the present embodiment also exhibits high reliability enabling a long term of use.

The examples according to the present invention will be specifically described below, although the present invention is not limited to the examples described below.

Example 1

Samples were produced, where the average grain sizes of a metal and the thickness ratios of the first region and the second region in the metal wiring layer were different, and measurements of the adhesion strength and the thermal conductivity and a heat cycle test were performed.

Initially, the aluminum oxide based sintered body having an aluminum oxide content of 96 percent by mass was produced by employing silicon oxide and magnesium oxide as sintering aids. In this regard, the ceramic sintered body 11 was grooved in such a way that multiple samples were able to be produced.

Subsequently, the first metal pastes constituting the first regions of Sample Nos. 1 to 7 were produced by blending 82 percent by mass of mixed metal powder prepared by mixing metal powders made from copper having different average particle diameters (average particle diameter 2.8 μm:average particle diameter 0.4 μm=7:3), 3 percent by mass of $Bi_2O_3$—$SiO_2$—$B_2O_3$ based glass powder having an average particle diameter of 2.5 μm and a softening point of 630° C., and 15 percent by mass of organic vehicle (acrylic resin serving as organic binder:terpineol serving as organic solvent=1:4).

Also, the second metal pastes constituting the second regions of Sample Nos. 1 to 7 were produced by blending 85 percent by mass of metal powder made from copper having an average particle diameter of 2.8 μm and 15 percent by mass of organic vehicle (acrylic resin serving as organic binder:terpineol serving as organic solvent=1:4).

Then, the resulting first metal paste was used and printing was performed on one principal surface of the ceramic sintered body 11 by a screen printing method. The number of printing was adjusted in such a way that the thickness of the first region shown in Table 1 was achieved, and drying and firing were performed after every printing. Thereafter, the second metal paste was printed on the first region. Also, the number of printing was adjusted in such a way that the thickness of the first region shown in Table 1 was achieved, and drying and firing were performed after every printing.

In this regard, the metal wiring layer 12 was formed having a thickness of 70 μm. Meanwhile, drying was performed at 100° C. and, thereafter, firing was performed by holding in a nitrogen atmosphere having an oxygen concentration adjusted to be 5 ppm at a maximum temperature of 900° C. for 0.8 hours. In this manner, circuit boards of Sample Nos. 1 to 7 provided with the metal wiring layer 12 on one principal surface of the ceramic sintered body 11 were obtained.

Also, Sample No. 8 was produced in the same method as those in production of Sample Nos. 1 to 7 except that a metal powder in which the proportion of average particle diameter of 5.9 μm was 7 and the proportion of average particle diameter of 0.84 μm was 3 was used for the first metal paste and a metal powder having an average particle diameter of 1.3 μm was used for the second metal paste.

Subsequently, the surface cut in the thickness direction of each sample was specified to be a measurement surface. The boundary of the first region and the second region of the resulting surface was identified by examining the mapping of Si on the basis of EPMA. The distance from the principal surface to the boundary was specified to be the thickness of the first region and the distance from the boundary to the surface was specified to be the thickness of the second region, as shown in Table 1.

Meanwhile, as for the method for measuring the thermal conductivity, a test piece, in which the ceramic sintered body 11 and the metal wiring layer 12 were adhered, having a diameter of 10 mm was cut from each sample, the density was determined by an Archimedes method and, thereafter, the sample was lowered from room temperature to −45° C. and was held for 15 minutes, the temperature was raised and held at 125° C. for 15 minutes and, thereafter, the temperature was lowered to room temperature. In this regard, 20 test pieces per sample were tested, 1 test piece per sample was taken every 50 cycles between 2,000 cycles and 3,000 cycles, the interface between the ceramic sintered body and the metal wiring layer was observed by using SEM at a magnification of 1,000 times, and the number of cycles when peeling was identified is shown in Table 1.

TABLE 1

| | Metal wiring layer | | | | | | |
|---|---|---|---|---|---|---|---|
| | First region | | Second region | | | | The |
| Sample No. | Average grain size (μm) | Thickness (%) | Average grain size (μm) | Thickness (%) | Adhesion strength (N/2 × 2 mm²) | Thermal conductivity (W/m · K) | number of cycles (cycles) |
| 1 | 4.2 | 30 | 8.8 | 70 | 28 | 113 | 2150 |
| 2 | 4.2 | 35 | 8.8 | 65 | 35 | 109 | 2250 |
| 3 | 4.2 | 40 | 8.8 | 60 | 42 | 104 | 2350 |
| 4 | 4.2 | 55 | 8.8 | 45 | 55 | 96 | 2500 |
| 5 | 4.2 | 60 | 8.8 | 40 | 58 | 91 | 2350 |
| 6 | 4.2 | 70 | 8.8 | 30 | 59 | 83 | 2250 |
| 7 | 4.2 | 75 | 8.8 | 25 | 60 | 74 | 2150 |
| 8 | 8.8 | 60 | 4.2 | 40 | 20 | 96 | 2100 | thermal conductivity was determined by a laser flash method in conformity with JIS R1611-2010, as shown in Table 1.

Next, the method for measuring the adhesion strength will be described. Initially, a Sn-plated copper wire having a diameter of 0.6 mm was soldered on the surface of the metal wiring layer 12 having a size of 2 mm×2 mm with a soldering apparatus (for example, XA-100 produced by TAMURA KAKEN CORPORATION) at a temperature of 225° C.±5° C., where solder in which 2 percent by mass of Ag relative to the whole was contained in eutectic solder composed of Sn and Pb at a ratio of 6:4 was used and a rosin based synthetic resin mixed with ketone and alcohol based solvent was used as a flux, as preparation for measuring the adhesion strength.

Subsequently, a die shearing tester (Model: 520D) produced by ANZA TECH was used, the Sn-plated copper wire was pulled at a rate of 7.62 mm/min, and the strength at the point in time when the metal wiring layer was peeled from the ceramic sintered body was measured, so that the adhesion strength of the metal wiring layer to the ceramic sintered body was measured. In this regard, the number of measurements was specified to be 10 per sample and the average value thereof is shown in Table 1.

Also, the metal wiring layer peeled in the adhesion strength measurement was used, the peeling surface (principal surface side before peeling) was specified to be the measurement surface for measuring the average grain size of the metal in the first region and the surface opposite to the peeling surface (surface of the metal wiring layer before peeling) was specified to be a measurement surface for measuring the average grain size of the metal in the second region, observation was performed by using SEM at a magnification of 3,000 times, and the average grain sizes were calculated by using image analysis software "A-zou kun" (registered trade mark, produced by Asahi Kasei Engineering Corporation), as shown in Table 1.

In addition, a thermal shock test chamber was used and a heat cycle test was performed, where one cycle was specified to be a cycle in which the environmental temperature of each As is clear from Table 1, Sample No. 1 in which the thickness of the first region was less than 35% of the thickness of the metal wiring layer exhibited low adhesion strength of 28 N/2×2 mm². Also, Sample No. 7 in which the thickness of the first region was more than 70% of the thickness of the metal wiring layer had a low thermal conductivity of 74 W/m·K. Meanwhile, Sample No. 8 in which the average grain size in the first region is larger than the average grain size in the second region exhibited low adhesion strength of 20 N/2×2 mm². Also, as for Sample Nos. 1, 7, and 8, the results of the heat cycle test were 2,150 cycles or less and, therefore, the thermal reliability was poor.

On the other hand, as for Sample Nos. 2 to 6, the adhesion strength was 35 N/2×2 mm² or more, the thermal conductivity was 83 W/m·K or more, and the results of the heat cycle test were 2,250 cycles or more. As a result, the thickness of the first region was 35% or more and 70% or less of the thickness of the metal wiring layer and the average grain size of the metal in the first region was smaller than the average grain size of the metal in the second region and, therefore, it was found that the circuit boards had high adhesion strength, good heat dissipation characteristics, and high reliability.

Example 2

Next, samples were produced, where the thickness ratios of the first region to the second region and the average grain sizes in the second region were specified to be the same, and the average grain sizes in the first region were specified to be different in the metal wiring layer 12, and measurements of the adhesion strength and the thermal conductivity and a heat cycle test were performed.

In this regard, the average grain size in the first region was specified by adjusting the size of the mixed metal powder used for the first metal paste. Meanwhile, various measurements and calculations were performed by the same methods as those in Example 1. The results are shown in Table 2.

TABLE 2

| Sample No. | Metal wiring layer | | | | Adhesion strength (N/2 × 2 mm²) | Thermal conductivity (W/m · K) | The number of cycles (cycles) |
|---|---|---|---|---|---|---|---|
| | First region | | Second region | | | | |
| | Average grain size (μm) | Thickness (%) | Average grain size (μm) | Thickness (%) | | | |
| 9  | 2.4 | 55 | 9.4 | 45 | 65 | 83  | 2300 |
| 10 | 3.0 | 55 | 9.4 | 45 | 60 | 91  | 2400 |
| 11 | 4.8 | 55 | 9.4 | 45 | 52 | 100 | 2500 |
| 12 | 5.9 | 55 | 9.4 | 45 | 50 | 108 | 2600 |
| 13 | 7.2 | 55 | 9.4 | 45 | 45 | 111 | 2450 |
| 14 | 8.0 | 55 | 9.4 | 45 | 40 | 117 | 2400 |
| 15 | 8.5 | 55 | 9.4 | 45 | 26 | 120 | 2250 |

As is clear from Table 2, the reliability of the circuit boards of Sample Nos. 10 to 14 was able to be enhanced as compared with that of Sample Nos. 9 and 15 because the adhesion strength or the thermal conductivity was higher, the result of the heat cycle test was better, and the average grain size in the first region was 3.0 μm or more and 8.0 μm or less.

Example 3

Next, samples were produced, where the thickness ratios of the first region to the second region and the average grain sizes in the first region were specified to be the same, and the average grain sizes in the second region were specified to be different in the metal wiring layer 12, and measurements of the adhesion strength and the thermal conductivity and a heat cycle test were performed.

In this regard, the average grain size in the second region was specified by adjusting the size of the mixed metal powder used for the second metal paste. Meanwhile, various measurements and calculations were performed by the same methods as those in Example 1. In addition, the arithmetic average roughness (Ra) of the surface of the metal wiring layer 12 was measured with a contact surface roughness meter on the basis of JIS B0601-2001. The results are shown in Table 3.

ness (Ra) of the surface of the metal wiring layer and, therefore, preferably, the above-described characteristics were exhibited and the average grain size in the second region was 9.0 μm or more and 13.0 μm or less.

Example 4

Next, samples were produced, where the number of copper oxide grains present at grain boundaries was different on the surface of the metal wiring layer, and the volume resistivity and the adhesion strength before and after a plating treatment were measured.

In this regard, in the production, Sample Nos. 23 to 27 were produced by the same method as with Sample No. 19 in Example 3 except that a metal powder exhibiting d10 of 1.3 μm in particle size distribution was used as the second metal paste and the firing atmosphere was adjusted to have an oxygen concentration shown in Table 1. Meanwhile, as for the plating, 4 μm of nickel (Ni) film, 0.1 μm of palladium (Pd) film, and 0.1 μm of gold (Au) film were formed by a known electroless plating method.

Then, as for the counting of copper oxide present at grain boundaries, initially, the surface of the metal wiring layer was

TABLE 3

| Sample No. | Metal wiring layer | | | | Adhesion strength (N/2 × 2 mm²) | Thermal conductivity (W/m · K) | The number of cycles (cycles) | Arithmetic average roughness (μm) |
|---|---|---|---|---|---|---|---|---|
| | First region | | Second region | | | | | |
| | Average grain size (μm) | Thickness (%) | Average grain size (μm) | Thickness (%) | | | | |
| 16 | 6.1 | 55 | 8.5  | 45 | 49 | 96  | 2450 | 0.2 |
| 17 | 6.1 | 55 | 9.0  | 45 | 48 | 105 | 2550 | 0.2 |
| 18 | 6.1 | 55 | 10.7 | 45 | 48 | 114 | 2650 | 0.3 |
| 19 | 6.1 | 55 | 11.2 | 45 | 47 | 120 | 2800 | 0.5 |
| 20 | 6.1 | 55 | 12.1 | 45 | 47 | 123 | 2750 | 1.1 |
| 21 | 6.1 | 55 | 13.0 | 45 | 46 | 127 | 2650 | 1.9 |
| 22 | 6.1 | 55 | 13.5 | 45 | 41 | 130 | 2500 | 3.2 |

As is clear from Table 3, the reliability of the circuit boards of Sample Nos. 17 to 21 was able to be enhanced as compared with that of Sample Nos. 16 and 22 because the adhesion strength or the thermal conductivity was higher, the result of the heat cycle test was better, and the average grain size in the second region was 9.0 μm or more and 13.0 μm or less.

Also, it was found that the average grain size in the second region exerted an influence on the arithmetic average roughobserved by using SEM at a magnification of 3,000 times and existence places of grain boundaries in the observation region were examined. Subsequently, the region where the existence region of Cu in the mapping and the existence region of O in the mapping obtained by using EPMA overlap one another was specified to be the existence place of copper oxide. The existence places of grain boundaries were checked against existence places of copper oxide. The number of places where the existence places of the two overlap one another were counted as copper oxide grains present at grain boundaries.

Also, the volume resistivity of the metal wiring layer was measured by a four-prove method in conformity with JIS C5012-1993. Also, the measurement of adhesion strength before and after plating was performed by the same method as with Example 1. The results are shown in Table 4.

TABLE 4

| Sample No. | Oxygen concentration in firing (ppm) | The number of copper oxide grains at grain boundaries (grains) | Volume resistivity ($\Omega \cdot m$) | Adhesion strength (N/2 × 2 mm$^2$) Before plating | After plating |
|---|---|---|---|---|---|
| 23 | 5 | 0 | $10^{-7}$ | 47 | 40 |
| 24 | 30 | 15 | $10^{-7}$ | 47 | 43 |
| 25 | 80 | 50 | $10^{-8}$ | 47 | 44 |
| 26 | 120 | 80 | $10^{-8}$ | 47 | 45 |
| 27 | 150 | 100 | $10^{-9}$ | 47 | 47 |

As shown in Table 4, differences in adhesion strength between before and after the plating of Sample Nos. 24 to 26 were small as compared with that of Sample No. 23, and the volume resistivities of Sample Nos. 24 to 26 were low as compared with that of Sample No. 27. As is clear from this result, in the case where 15 or more and 80 or less of copper oxide grains were present at grain boundaries in 1,000 µm$^2$ of observation region, high adhesion strength was able to be maintained after the plating treatment and, in addition, low electric resistance was able to be maintained.

Example 5

Next, a sample was produced, where the silicon oxide contents on the principal surface side and the second region side in the first region were different, and the adhesion strength before and after the plating treatment was measured.

Initially, two types of first metal pastes for constituting the first region of the metal wiring layer were prepared. A first metal paste (A) which was the same as that in production of Sample No. 19 in Example 3 was prepared as the first paste, and a first metal paste (B) in which the Bi$_2$O$_3$ content was decreased and the silicon oxide content was increased in the glass composition was prepared as the second paste. Then, the first region was formed by printing and drying the first metal paste (A) on the principal surface of the ceramic sintered body 11 and, thereafter, printing and drying the first metal paste (B), followed by performing firing. Also, Sample No. 29 was produced by the same method as with the production of Sample No. 19 in Example 3 except that two types of metal pastes were used. In this regard, Sample No. 28 was the same as Sample No. 19 in Example 3.

Then, the contents of silicon oxide on the principal surface side and the second region side in the first region was determined by cutting the sample in the thickness direction, performing cross-section polishing and, thereafter, observing the principal surface side and the second region side in the first region by using SEM at a magnification of 3,000 times, followed by using an attached EDS. Also, the measurement of adhesion strength before and after plating was performed by the same method as with Example 1. The results are shown in Table 5.

TABLE 5

| Sample No. | Silicon oxide content in first region (percent by mass) | | Adhesion strength (N/2 × 2 mm$^2$) | |
|---|---|---|---|---|
| | Principal surface side | Second region side | Before plating | After plating |
| 28 | 14 | 14 | 47 | 40 |
| 29 | 14 | 30 | 47 | 47 |

As shown in Table 5, differences in adhesion strength between before and after the plating of Sample No. 29 was small as compared with that of Sample No. 28. As is clear from this result, the reliability of the circuit board was able to be enhanced by allowing the amount of silicon oxide, which constituted the glass component in the first region, on the second region side to become larger than that on the principal surface side.

REFERENCE SIGNS LIST

1: electronic apparatus
10: circuit board
11: ceramic sintered body
12: metal wiring layer
12a: first region
12b: second region
13: electronic component
14: electrode pad

The invention claimed is:

1. A circuit board comprising a ceramic sintered body and a metal wiring layer disposed on at least one principal surface of the ceramic sintered body, wherein the metal wiring layer includes a first region which is in contact with the principal surface and which contains a glass component and a second region which is located on the first region and which does not contain a glass component, the thickness of the first region is 35% or more and 70% or less of the thickness of the metal wiring layer, and the average grain size of a metal in the first region is smaller than the average grain size of a metal in the second region.

2. The circuit board according to claim 1, wherein the average grain size of the metal in the first region is 3.0 µm or more and 8.0 µm or less.

3. The circuit board according to claim 1, wherein the average grain size of the metal in the second region is 9.0 µm or more and 13.0 µm or less.

4. The circuit board according to claim 1, wherein copper oxide is present on the surface of the metal wiring layer, and 15 or more and 80 or less of copper oxide grains are present at grain boundaries in 1,000 µm$^2$ of observation region.

5. The circuit board according to claim 1, wherein silicon oxide constitutes the glass component in the first region, and the amount of silicon oxide on the second region side is larger than that on the principal surface side in the first region.

6. An electronic apparatus, wherein an electronic component is mounted on the circuit board according to claim 1.

* * * * *